United States Patent
Leu et al.

(10) Patent No.: US 8,907,328 B2
(45) Date of Patent: Dec. 9, 2014

(54) ORGANIC LIGHT EMITTING DIODE HAVING POLYMIDE-CONTAINING FLEXIBLE SUBSTRATE AND HAVING SURFACE WITH BULGE AND GROOVE STRUCTURE

(71) Applicant: Industrial Technology Research Institute, Hsinchu (TW)

(72) Inventors: Chyi-Ming Leu, Hsinchu County (TW); Yueh-Chuan Huang, Hsinchu County (TW); Mei-Rurng Tseng, Hsinchu (TW); Meng-Ting Hsieh, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 14 days.

(21) Appl. No.: 13/801,779

(22) Filed: Mar. 13, 2013

(65) Prior Publication Data

US 2014/0166993 A1    Jun. 19, 2014

(30) Foreign Application Priority Data

Dec. 18, 2012    (TW) .................................. 101147996

(51) Int. Cl.
*H01L 51/52* (2006.01)
*H01L 51/50* (2006.01)
*H01L 51/00* (2006.01)

(52) U.S. Cl.
CPC ........ *H01L 51/5004* (2013.01); *H01L 51/5268* (2013.01); *H01L 51/5275* (2013.01); *H01L 51/0097* (2013.01); *H01L 2251/5338* (2013.01)
USPC ........................................................... 257/40

(58) Field of Classification Search
CPC .................................................. H01L 27/3234
See application file for complete search history.

(56) References Cited

U.S. PATENT DOCUMENTS

| | | | |
|---|---|---|---|
| 6,777,871 B2 * | 8/2004 | Duggal et al. | 313/506 |
| 6,875,554 B2 | 4/2005 | Hatanaka et al. | |
| 6,927,012 B2 | 8/2005 | Hatanaka et al. | |
| 7,173,276 B2 | 2/2007 | Choi et al. | |
| 7,666,573 B2 | 2/2010 | Okazaki et al. | |
| 7,741,145 B2 | 6/2010 | Choi et al. | |
| 7,972,725 B2 | 7/2011 | Krause et al. | |
| 8,022,110 B2 | 9/2011 | Yamada et al. | |
| 8,158,971 B2 | 4/2012 | Choi et al. | |

(Continued)

FOREIGN PATENT DOCUMENTS

TW    201122025 A    7/2011
TW    201123526 A1   7/2011

OTHER PUBLICATIONS

Chau et al., "Transparent high refractive index nanocomposite thin films", Materials Letters, 2007, 61, pp. 2908-2910.

(Continued)

*Primary Examiner* — Stephen W Smoot
(74) *Attorney, Agent, or Firm* — Birch, Stewart, Kolasch & Birch, LLP

(57) ABSTRACT

Disclosed is an organic light emitting diode (OLED), including a flexible substrate having a surface with a bulge and groove structure. The OLED also includes a first electrode on the flexible substrate, an organic light emitting layer on the first electrode, and a second electrode on the organic light emitting layer. The flexible substrate includes polyimide.

10 Claims, 1 Drawing Sheet

(56) References Cited

U.S. PATENT DOCUMENTS

| | | | |
|---|---|---|---|
| 2006/0049749 A1 | 3/2006 | Ishikawa et al. | |
| 2006/0124925 A1* | 6/2006 | Kondo et al. | 257/40 |
| 2009/0015142 A1 | 1/2009 | Potts et al. | |
| 2009/0221777 A1 | 9/2009 | Chiba et al. | |
| 2010/0233618 A1 | 9/2010 | Kim et al. | |
| 2011/0123927 A1 | 5/2011 | Park et al. | |
| 2011/0155235 A1 | 6/2011 | Tseng et al. | |
| 2011/0193016 A1 | 8/2011 | Hirano et al. | |
| 2011/0261461 A1 | 10/2011 | Le et al. | |
| 2011/0262093 A1 | 10/2011 | Lamansky et al. | |
| 2012/0142808 A1 | 6/2012 | Izu et al. | |

OTHER PUBLICATIONS

Eom et al., "Close-packed hemispherical microlens arrays for light extraction enhancement in organic light-emitting devices", Organic Electronics, 2011, 12, pp. 472-476.

Melpignano et al., "Efficient light extraction and beam shaping from flexible, optically integrated organic light-emitting diodes", Applied Physics Letters, 2006, 88, pp. 153514-1 to 153514-3.

Reineke et al., "White organic light-emitting diodes with fluorescent tube efficiency", Nature, May 14, 2009, vol. 459, pp. 234-239.

Suzuki et al., "Preparation and characterization of Polyimide/ZnO Nano-hybrid Films Exhibiting High Refractive Indices", Journal of Photopolymer Science and Technology, 2010, vol. 23, No. 4, pp. 521-528.

Yu et al., "High transparent soluble polyimide/silica hybrid optical thin films", Polymer Testing, 2010, 29, pp. 33-40.

Taiwanese Office Action dated Aug. 13, 2014. Application No. 101147996.

* cited by examiner

ORGANIC LIGHT EMITTING DIODE HAVING POLYMIDE-CONTAINING FLEXIBLE SUBSTRATE AND HAVING SURFACE WITH BULGE AND GROOVE STRUCTURE

CROSS REFERENCE TO RELATED APPLICATIONS

The present application is based on, and claims priority from, Taiwan Application Serial Number 101147996, filed on Dec. 18, 2012, the disclosure of which is hereby incorporated by reference herein in its entirety

TECHNICAL FIELD

The technical field relates to an organic light emitting diode, and in particular relates to a substrate structure thereof.

BACKGROUND

Illumination consumes 15% to 25% of the total power in advanced countries. For the requirements of reduced energy consumption, light weight and thin shape, organic light emitting diode (OLED) is considered as a novel illumination source for the next generation. Conventional OLED device is a stack layered structure constructed by a cathode layer, organic material layers, a transparent electrode layer, and a substrate. Because refractive index mismatches between the interferences of the layered structure and the waveguide effect, a light produced by the organic layers will be reflected back to the substrate, the transparent electrode layer, or the organic layers and/or emits out of the substrate after several reflections with a decayed intensity or even to disappear. Accordingly, a novel method to improve light extraction efficiency of the OLED is called for.

SUMMARY

One embodiment of the disclosure provides an organic light emitting diode, comprising: a flexible substrate having a surface with a bulge and groove structure; a first electrode on the flexible substrate; an organic light emitting layer on the first electrode; and a second electrode on the organic light emitting layer, wherein the flexible substrate comprises polyimide.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
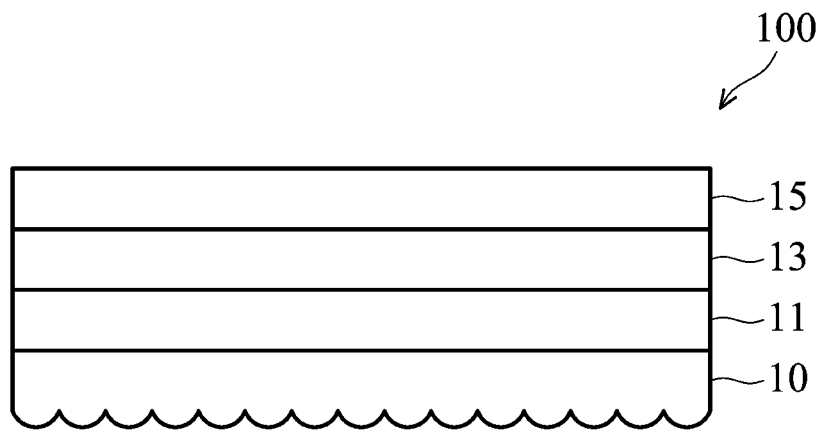
FIG. 1 shows an organic light emitting diode in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In one embodiment, an organic light emitting diode (OLED) 100 includes a flexible substrate 10, a first electrode 11 on the flexible substrate 10, an organic light emitting layer 13 on the first electrode 11, and a second electrode 15 on the organic light emitting layer 13, as shown in FIG. 1. In general, the first electrode 11 is a transparent material such as indium tin oxide (ITO), aluminum zinc oxide (AZO), indium zinc oxide (IZO), cadmium tin oxide (CTO), or the likes. The second electrode 15 is a reflective material such as titanium, tantalum, molybdenum, aluminum, neodymium, gold, silver, copper, or similar material. The emitted color of the organic light emitting layer 13 depending on the combination of a dopant and host material of the organic light emitting layer 13. In one embodiment, the host material in the organic light emitting layer 13 is tris(8-hydroxy quinoline)aluminum (III) (Alq3), and the dopant thereof is organic material including red dopants such as 4-dicyanomethylene-2-tert-butyl-6-(1,1,7,7-tetramethyljulolidin-4-yl-vinyl)-4H-pyran (DCJTB), green dopants such as 10-(2-Benzothiazolyl)-2,3,6,7-tetrahydro-1,1,7,7-tetramethyl-1H,5H,11H-(1)benzopyrano (6,7-8-I,j)quinolizin-11-one, (C545T), or blue dopants such as 4,4'-bis(2,2'-diphenylvinyl)-1,1'-biphenyl (DPVBi) or spiro-DPVBi. On the other hand, the host material of the organic light emitting layer 13 can be organic molecules including anthracene series such as 2-methyl-9,10-di(2-naphthyl)anthracene (MADN) or carbazole series such as 4,4'-bis(carbazole-9-yl)-biphenyl (CBP), N,N-'-dicarbazolyl-3,5-benzene (mCP), and Tris(carbazol-9-yl)benzene (tCP). The corresponding dopant of the organic host material is a metal dopant including iridium complexes such as bis(1-phenylisoquinoline)acetylacetonate iridium (PlQIr(acac)), bis(2-phenylquinolyl-N,C2) acetylacetonate iridium(III) (PQIr(acac)), or bis(2-phenyl quinolyl-N,C2')acetylacetonate iridium(III) (PQIr), or Pt complexes such as platinum octaethylporphine (PtOEP). The iridium complex applied to emit green light may be tris[2-(2-pyridinyl)phenyl-C,N]-iridium (abbreviated Ir(ppy)$_3$). A hole injection layer, a hole transport layer, or other layers can be disposed between the organic light emitting layer 13 and a positive electrode (e.g. the first electrode 11 or the second electrode 15), and an electron injection layer, an electron transport layer, or other layers can be disposed between the organic light emitting layer 13 and a negative electrode (e.g. the first electrode 11 or the second electrode 15), respectively, to further enhance the illumination efficiency of the organic light emitting diode 100.

Figure 2:
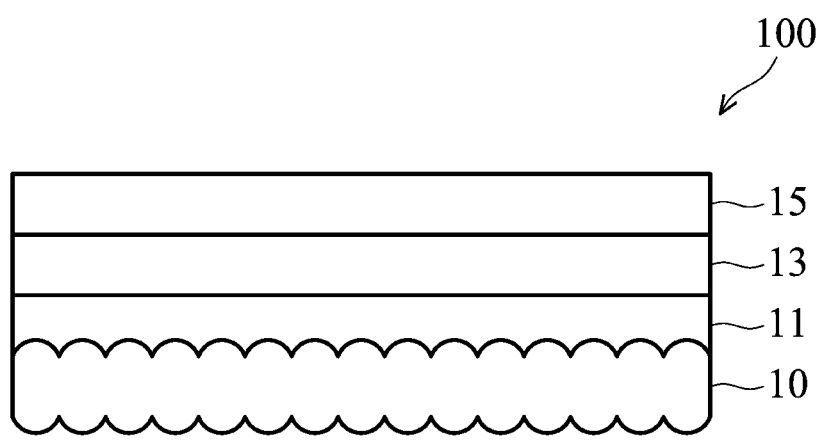
FIG. 2 shows an organic light emitting diode in one embodiment of the disclosure.

As shown in FIG. 1, the flexible substrate 10 has a top surface with a planar and smooth structure, and a bottom surface with a bulge and groove structure. Alternatively, the flexible substrate has a top surface with a bulge and groove structure, and a bottom surface with a bulge and groove structure, as shown in FIG. 2. The bulge and groove structure can be a regular structure of hemispherical shaped, pyramidal shaped, barrel shaped, or the likes, or another irregular structure. For a planarity of the first electrode 11 (e.g. ITO film) subsequently formed thereon and a flatness of the flexible substrate 10, the bulge and groove structure has an appropriate size of nanometer-scale to micrometer-scale. In one embodiment, the bulge and groove structure of the bottom surface of the flexible substrate 10 is a regular structure of hemispherical shape with a hemisphere height of 20 μm to 30 μm and a hemisphere diameter of 50 μm to 60 μm. In another embodiment, the bulge and groove structure of the bottom surface of the flexible substrate 10 is a regular structure of hemispherical shape with a hemisphere height of 50 nm to 70 nm and a hemisphere diameter of 150 nm to 190 nm. In one embodiment, the top surface of the flexible substrate 10 has a planar and smooth structure. In another embodiment, the top surface of the flexible substrate 10 has a bulge and groove structure such as an irregular crepe structure, wherein a top point and a bottom point of the crepe structure have a distance of less than or equal to 10 nm (≤10 nm). In another embodiment, a top point and a bottom point of the bulge or groove structure have a distance of less than or equal to 10 nm (≤10 nm).

The flexible substrate 10 having a surface with a bulge and groove structure can be formed as below. A polyimide solution can be coated on a carrier with a bulge and groove structure, and solvent of the polyimide solution is then removed to form the flexible substrate 10 having a top surface with a planar and smooth structure and a bottom surface with a bulge and groove structure corresponding to the bulge and groove structure of the carrier. If a thickness of the flexible substrate 10 is thin enough, the top surface of the flexible substrate 10 may conformally correspond to the bottom surface of the flexible substrate 10, such that the top and bottom surfaces of the flexible substrate 10 both have the bulge and groove structure. Alternately, the planar and smooth top surface of the flexible substrate 10 can be imprinted or physically rubbed to have a bulge and groove structure.

In another embodiment, the polyimide solution is directly coated on a planar and smooth carrier, and a solvent of the polyimide solution is removed to form a flexible substrate 10. Thereafter, the top surface of the flexible substrate 10 is imprinted or physically rubbed to have a bulge and groove structure, and the bottom surface of the flexible substrate 10 remains planar and smooth.

In one embodiment, the flexible substrate 10 has a thickness of 5 μm to 200 μm to mechanically support a layered structure formed thereon. The flexible substrate 10 includes a polyimide copolymerized of a diamine and a dianhydride. The diamine can be

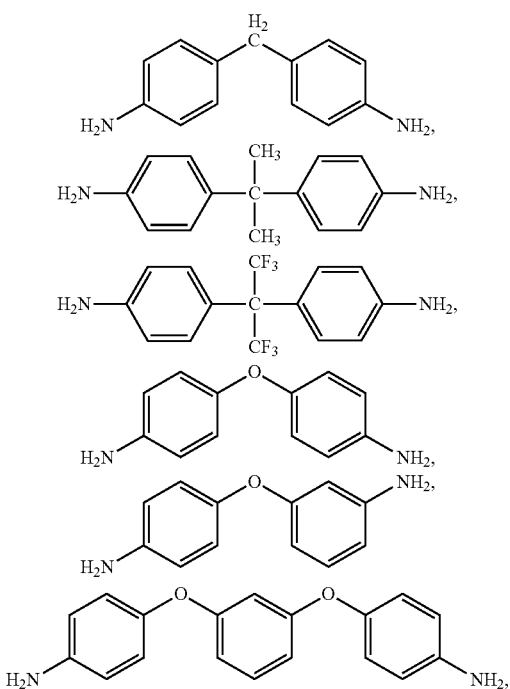

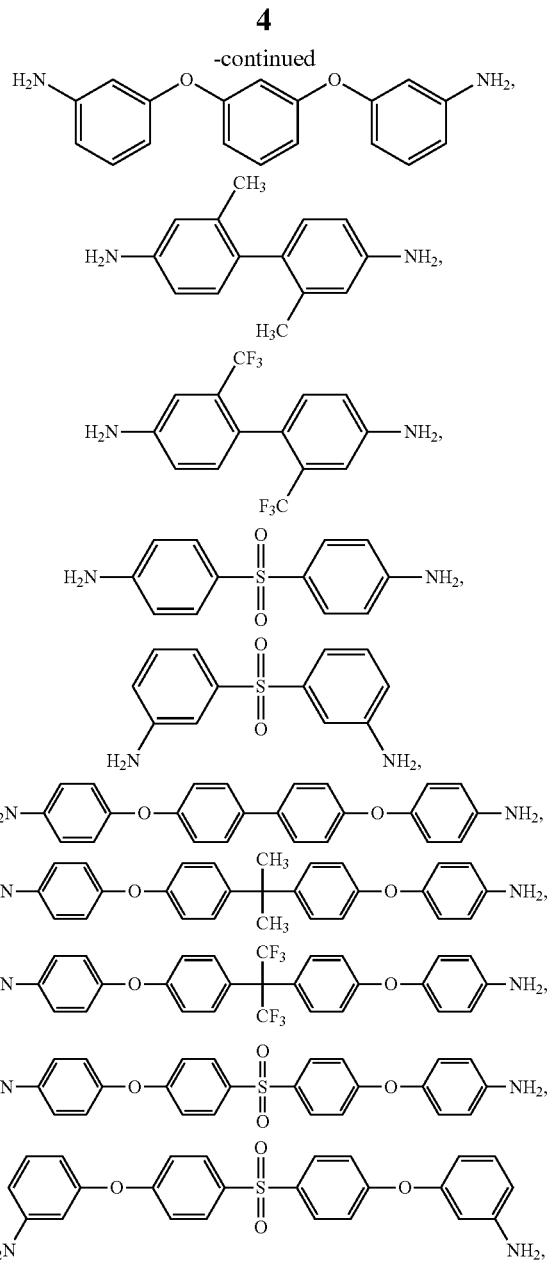

or combinations thereof. The dianhydride can be

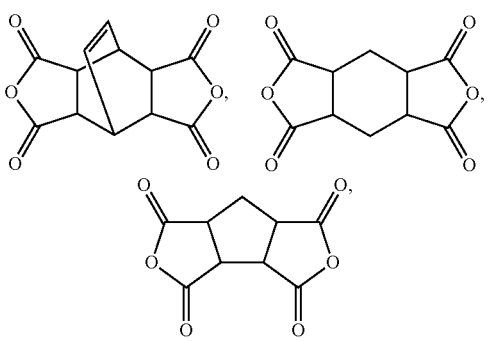

or combinations thereof. In one embodiment, the polyimide has a weight average molecular weight of 8000 mol/g to 100000 mol/g. In another embodiment, the polyimide has a weight average molecular weight of 9000 mol/g to 50000 mol/g.

In one embodiment, inorganic oxide particles such as titanium oxide, zirconium oxide, silicon oxide, aluminum oxide, another oxide, or combinations thereof can be further added into the polyimide and dispersed therein. For light transmittance and light extraction of the flexible substrate 10, the inorganic oxide particles and the polyimide have a proper weight ratio of greater than about 0:100 (>0:100) and less than or equal to about 80:20 (≤80:20). In another embodiment, the inorganic oxide particles and the polyimide have a proper weight ratio of greater than or equal to about 20:80 (≥20:80) and less than or equal to about 60:40 (≤60:40). The inorganic oxide particles may further improve the gas barrier effect, water resistance, and light extraction effect of the flexible substrate 10. In one embodiment, the size of the inorganic oxide particles range from about 1 nm to 200 nm. On the other hand, the inorganic oxide particles help to form the bulge and groove structure of the surface of the flexible substrate 10.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Synthesis and Physical Properties of Polyimide (PI-1)

First, a monomer A (2,2-bis[4-(4-aminophenoxy)phenyl] propane) and a monomer B (bicyclo[2,2,2]oct-7-ene-2,3,5,6-tetracarboxylic dianhydride) with a molar ratio of 5:5 were weighted. 82.7 g of the monomer A, 50 g of the monomer B, and 530.8 g of the m-cresol were added into a 2 L glass reaction tank. The mixture was reacted and stirred for 4 hours at 220° C. to form a polyimide solution with a solid content of 20%. The polyimide solution was reprecipitated by methanol, and the reprecipitation was dried to obtain a silk shaped polyimide. Dimethyl acetamide was added to the silk shaped polyimide to dissolve it, thereby preparing a polyimide (PI-1) solution with a solid content of 15%. The PI-1 has a b value (yellowness) of 2.37, a weight average molecular weight of 25024 mol/g, and a viscosity of 13225 cp.

Synthesis and Physical Properties of Polyimide (PI-2)

First, a monomer A (2,2-bis[4-(4-aminophenoxy)phenyl] propane) and a monomer B (4,4-diaminodiphenyl ether), and a monomer C (pyromellitic dianhydride) with a molar ratio of 3:7:10 were weighted. 28.2 g of the monomer A, 32.1 g of the monomer B, 50 g of the monomer C, and 441.4 g of the m-cresol were added into a 2 L glass reaction tank. The mixture was reacted and stirred for 4 hours at 220° C. to form a polyimide solution with a solid content of 20%. The polyimide solution was reprecipitated by methanol, and the reprecipitation was dried to obtain a silk shaped polyimide. Dimethyl acetamide was added to the silk shaped polyimide to dissolve it, thereby preparing a polyimide (PI-2) solution with a solid content of 15%. The PI-2 has a b value (yellowness) of 1.95, a weight average molecular weight of 18572 mol/g, and a viscosity of 10955 cp.

Synthesis and Physical Properties of Polyimide (PI-3)

First, a monomer A (4,4'-bis(3-aminophenoxy)diphenyl sulfone) and a monomer B (4,4-bis(4-aminophenoxy)biphenyl), and a monomer C (1,2,3,4-cyclopentanetetracarboxylic dianhydride) with a molar ratio of 5:5:10 were weighted. 51.5 g of the monomer A, 43.8 g of the monomer B, 50 g of the monomer C, and 581.1 g of the m-cresol were added into a 2 L glass reaction tank. The mixture was reacted and stirred for 4 hours at 220° C. to form a polyimide solution with a solid content of 20%. The polyimide solution was reprecipitated by methanol, and the reprecipitation was dried to obtain a silk shaped polyimide. Dimethyl acetamide was added to the silk shaped polyimide to dissolve it, thereby preparing a polyimide (PI-3) solution with a solid content of 15%. The PI-3 has a b value (yellowness) of 2.12, a weight average molecular weight of 10938 mol/g, and a viscosity of 5840 cp.

TABLE 1

| Serial No. | Monomer A |
|---|---|
| PI-1 | H₂N–⟨phenyl⟩–O–⟨phenyl⟩–C(CH₃)₂–⟨phenyl⟩–O–⟨phenyl⟩–NH₂ |
| PI-2 | H₂N–⟨phenyl⟩–O–⟨phenyl⟩–C(CH₃)₂–⟨phenyl⟩–O–⟨phenyl⟩–NH₂ |
| PI-3 | H₂N–⟨phenyl⟩–O–⟨phenyl⟩–SO₂–⟨phenyl⟩–O–⟨phenyl⟩–NH₂ |

TABLE 1-continued

| Serial No. | Monomer B | Monomer C | Monomer ratio |
|---|---|---|---|
| PI-1 | [structure: bicyclic dianhydride] | none | A/B = 5/5 |
| PI-2 | [structure: H$_2$N–C$_6$H$_4$–O–C$_6$H$_4$–NH$_2$] | [structure: cyclohexane dianhydride] | A/B/C = 3/7/10 |
| PI-3 | [structure: H$_2$N–C$_6$H$_4$–O–C$_6$H$_4$–C$_6$H$_4$–O–C$_6$H$_4$–NH$_2$] | [structure: bicyclic dianhydride] | A/B/C = 5/5/10 |

Comparative Example 1

A glass substrate (TFT grade) with a thickness of 0.7 mm was selected. ITO with a thickness of 200 nm, N,N'-Bis(naphthalen-1-yl)-N,N'-bis(phenyl)benzidine (NPB) with a thickness of 50 nm, CBP:Irppy3(3%) with a thickness of 10 nm, 2,9-dimethyl-4,7-diphenyl-1,10-phenanthroline (BCP) with a thickness of 10 nm, Alq3 with a thickness of 35 nm, LiF with a thickness of 0.5 nm, and aluminum with a thickness of 120 nm were sequentially evaporated on the planar and smooth surface of the glass substrate. As such, an OLED emitting a green light was obtained, and a current efficiency thereof is tabulated in Table 2.

Comparative Example 2

PI-1 was coated on a planar and smooth glass substrate to form a flexible substrate having a top surface with a planar and smooth structure, a bottom surface with a planar and smooth structure, and a thickness of 30 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth surface of the flexible substrate. As such, an OLED emitting a green light was obtained, and a current efficiency thereof is tabulated in Table 2.

Comparative Example 3

A yellow polyimide (YPI, polymerized of pyromellitic acid dianhydride and 4,4-oxydianailine (ODA)) was coated on a planar and smooth glass substrate to form a flexible substrate having a top surface with a planar and smooth structure, a bottom surface with a planar and smooth structure, and a thickness of 30 μm. ITO with a thickness of 200 nm, NPB with a thickness of 50 nm, CBP:Irppy3(3%) with a thickness of 10 nm, BCP with a thickness of 35 nm, LiF with a thickness of 0.5 nm, and aluminum with a thickness of 120 nm were sequentially evaporated on the planar and smooth surface of the flexible substrate. As such, an OLED emitting a green light was obtained, and a current efficiency thereof is tabulated in Table 2.

Example 1

The PI-1 was coated on a carrier with an irregular bulge and groove structure, and solvent thereof was then removed to form a flexible substrate having a top surface with a planar and smooth structure and a bottom surface with an irregular bulge and groove structure. A top point and a bottom point of the irregular bulge and groove structure had a distance of less than 3 μm, and the flexible substrate had a thickness of 110 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth surface of the flexible substrate. As such, an OLED emitting a green light was obtained, and a current efficiency thereof is tabulated in Table 2.

Example 2

The PI-2 was coated on a carrier with an irregular bulge and groove structure, and solvent thereof was then removed to form a flexible substrate having a top surface with a planar and smooth structure and a bottom surface with an irregular bulge and groove structure. A top point and a bottom point of the irregular bulge and groove structure had a distance of less than 3 μm, and the flexible substrate had a thickness of 110 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth surface of the flexible substrate. As such, an OLED emitting a green light was obtained, and a current efficiency thereof is tabulated in Table 2.

Example 3

The PI-3 was coated on a carrier with an irregular bulge and groove structure, and solvent thereof was then removed to form a flexible substrate having a top surface with a planar and smooth structure and a bottom surface with an irregular bulge and groove structure. A top point and a bottom point of the irregular bulge and groove structure had a distance of less than 3 μm, and the flexible substrate had a thickness of 110 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth top surface of the flexible substrate. As such, an OLED emitting a green light was obtained, and a current efficiency thereof is tabulated in Table 2.

Example 4

The PI-1 was coated on a carrier with a regular bulge and groove structure of hemispheric shape, and solvent thereof was then removed to form a flexible substrate having a top surface with a planar and smooth structure and a bottom surface with a regular bulge and groove structure of hemispheric shape (with a hemisphere height of 20 μm to 30 μm and a hemisphere diameter of 50 μm to 60 μm). The flexible substrate had a thickness of 120 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth top surface of the flexible substrate. As such, an OLED emitting a green light was obtained, and a current efficiency thereof is tabulated in Table 2.

Example 5

The PI-2 was coated on a carrier with a regular bulge and groove structure of hemispheric shape, and solvent thereof was then removed to form a flexible substrate having a top surface with a planar and smooth structure and a bottom surface with a regular bulge and groove structure of hemispheric shape (with a hemisphere height of 20 μm to 30 μm and a hemisphere diameter of 50 μm to 60 μm). The flexible substrate had a thickness of 120 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth top surface of the flexible substrate. As such, an OLED emitting a green light was obtained, and a current efficiency thereof is tabulated in Table 2.

Example 6

The PI-3 was coated on a carrier with a regular bulge and groove structure of hemispheric shape, and solvent thereof was then removed to form a flexible substrate having a top surface with a planar and smooth structure and a bottom surface with a regular bulge and groove structure of hemispheric shape (with a hemisphere height of 50 nm to 70 nm and a hemisphere diameter of 150 nm to 190 nm). The flexible substrate had a thickness of 120 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the planar and smooth top surface of the flexible substrate. As such, an OLED emitting a green light was obtained, and a current efficiency thereof is tabulated in Table 2.

Example 7

80 parts by weight of the PI-3 and 20 parts by weight of silicon oxide particles (with a diameter of 20 nm) were mixed, and the mixture was coated on a carrier with an irregular bulge and groove structure, and solvent thereof was then removed to form a flexible substrate having a top surface with a irregular crepe structure and a bottom surface with an irregular bulge and groove structure. The top point and the bottom point of the irregular bulge and groove structure of the bottom surface had a distance of less than 3 μm. The top point and the bottom point of the irregular crepe structure of the top surface had a distance of less than 10 nm. The flexible substrate had a thickness of 110 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the top surface of the flexible substrate. As such, an OLED emitting a green light was obtained, and a current efficiency thereof is tabulated in Table 2.

Example 8

40 parts by weight of the PI-3 and 60 parts by weight of silicon oxide particles (with a size of 200 nm) were mixed, and the mixture was coated on a carrier with an regular bulge and groove structure of hemispheric shape, and solvent thereof was then removed to form a flexible substrate having a top surface with a irregular crepe structure and a bottom surface with a regular bulge and groove structure of hemispherical shape (with a hemisphere height of 50 nm to 70 nm and a hemisphere diameter of 150 nm to 190 nm). The silicon oxide particles helped to form the irregular crepe structure of the top surface. The top point and the bottom point of the irregular crepe structure of the top surface had a distance of less than 10 nm. The flexible substrate had a thickness of 120 μm. ITO with a thickness of 200 nm, NPB with a thickness of 50 nm, CBP:Irppy3(3%) with a thickness of 10 nm, BCP with a thickness of 10 nm, Alq3 with a thickness of 35 nm, LiF with a thickness of 0.5 nm, and aluminum with a thickness of 120 nm were sequentially evaporated on the top surface of the flexible substrate. As such, an OLED emitting a green light was obtained, and a current efficiency thereof is tabulated in Table 2.

TABLE 2

| | Substrate | Bulge and groove structure of a top surface | Bulge and groove structure of a bottom surface | Current efficiency (lm/W) | Efficiency enhancement |
|---|---|---|---|---|---|
| Comparative Example 1 | Glass | none | none | 12.99 | — |
| Comparative Example 2 | PI-1 | none | none | 13.39 | +3.08% |
| Comparative Example 3 | YPI | none | none | 12.68 | −2.39% |
| Example 1 | PI-1 | none | Irregular | 19.09 | +46.96% |
| Example 2 | PI-2 | none | Irregular | 18.49 | +42.34% |
| Example 3 | PI-3 | none | Irregular | 18.08 | +39.18% |
| Example 4 | PI-1 | none | Regular hemispherical shaped | 23.68 | +82.29% |
| Example 5 | PI-2 | none | Regular hemispherical shaped | 23.16 | +78.29% |
| Example 6 | PI-3 | none | Regular hemispherical shaped | 22.21 | +70.98% |
| Example 7 | PI-3 + silicon oxide | Irregular crepe | Irregular | 20.03 | +54.20% |
| Example 8 | PI-3 + silicon oxide | Irregular crepe | Regular hemispherical shaped | 23.42 | +80.29% |

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. An organic light emitting diode, comprising:
   a flexible substrate having a surface with a bulge and groove structure;
   a first electrode on the flexible substrate;
   an organic light emitting layer on the first electrode; and
   a second electrode on the organic light emitting layer,
   wherein the flexible substrate comprises polyimide.

2. The organic light emitting diode as claimed in claim 1, wherein the bulge and groove structure comprises a regular structure of hemispherical shape, pyramidal shape, or barrel shape.

3. The organic light emitting diode as claimed in claim 1, wherein the bulge and groove structure comprises an irregular structure.

4. The organic light emitting diode as claimed in claim 1, wherein the bulge and groove structure has a size of nanometer-scale to micrometer-scale.

5. The organic light emitting diode as claimed in claim 1, wherein the flexible substrate has a thickness of 5 μm to 200 μm.

6. The organic light emitting diode as claimed in claim 1, wherein the polyimide is polymerized of a diamine and a dianhydride, wherein the diamine includes

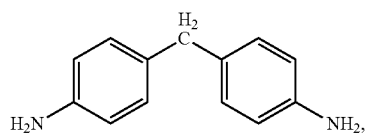

-continued

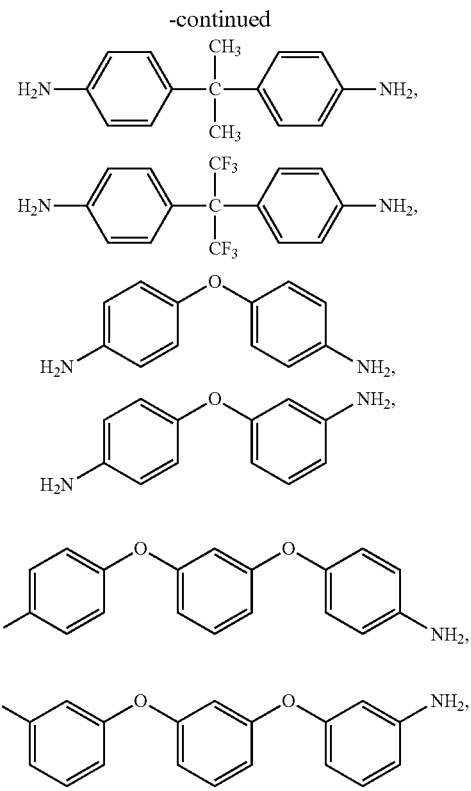

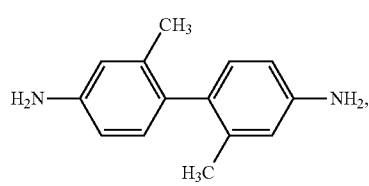

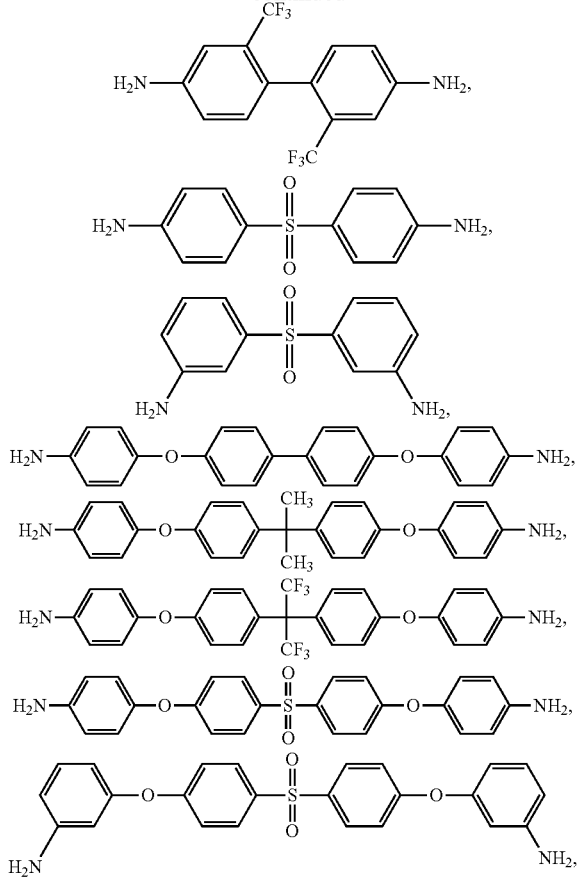

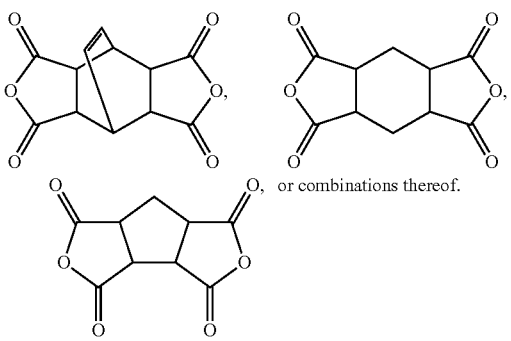

or combinations thereof, and the dianhydride comprises or combinations thereof.

7. The organic light emitting diode as claimed in claim 1, wherein the polyimide has a weight average molecular weight of 8000 mol/g to 100000 mol/g.

8. The organic light emitting diode as claimed in claim 1, wherein the flexible substrate further comprises inorganic oxide particles dispersed in the polyimide, and the weight ratio of the inorganic oxide particles and the polyimide is greater than 0:100 (>0:100) and less than or equal to 80:20 (≤80:20).

9. The organic light emitting diode as claimed in claim 8, wherein the size of inorganic oxide particles range from 1 nm to 200 nm.

10. The organic light emitting diode as claimed in claim 8, wherein the inorganic oxide particles comprises titanium oxide, zirconium oxide, silicon oxide, aluminum oxide, or combinations thereof.

\* \* \* \* \*